United States Patent
Huang et al.

(10) Patent No.: US 9,257,421 B2
(45) Date of Patent: Feb. 9, 2016

(54) TRANSIENT VOLTAGE SUPPRESSION DEVICE AND MANUFACTURING METHOD THEREOF

(71) Applicants: Tsung-Yi Huang, Hsinchu (TW); Kuo-Hsuan Lo, Taoyuan (TW); Wu-Te Weng, Hsinchu (TW)

(72) Inventors: Tsung-Yi Huang, Hsinchu (TW); Kuo-Hsuan Lo, Taoyuan (TW); Wu-Te Weng, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 14/728,189

(22) Filed: Jun. 2, 2015

(65) Prior Publication Data
US 2015/0364460 A1    Dec. 17, 2015

Related U.S. Application Data

(60) Provisional application No. 62/011,795, filed on Jun. 13, 2014.

(51) Int. Cl.
*H01L 29/66* (2006.01)
*H01L 27/02* (2006.01)
*H01L 29/866* (2006.01)
*H01L 21/762* (2006.01)

(52) U.S. Cl.
CPC ...... *H01L 27/0255* (2013.01); *H01L 21/76224* (2013.01); *H01L 29/66106* (2013.01); *H01L 29/66136* (2013.01); *H01L 29/866* (2013.01)

(58) Field of Classification Search
USPC .............. 257/186, 199, 481–482, 493, 589, 257/603–606, E31.063, E29.18, 257/E29.334–E29.335, 46, 104–106, 257/E21.354, E31.355, E21.356, E21.357; 438/91, 380, 983
See application file for complete search history.

(56) References Cited

U.S. PATENT DOCUMENTS

| | | | |
|---|---|---|---|
| 5,880,511 A | 3/1999 | Yu et al. | |
| 2007/0073807 A1* | 3/2007 | Bobde | H01L 29/407 709/203 |

* cited by examiner

*Primary Examiner* — Dao H Nguyen
*Assistant Examiner* — Tram H Nguyen
(74) *Attorney, Agent, or Firm* — Tung & Associates

(57) ABSTRACT

The present invention discloses a transient voltage suppression (TVS) device and a manufacturing method thereof. The TVS device limits a voltage drop between two terminals thereof not to exceed a clamp voltage. The TVS device is formed in a stack substrate including a semiconductor substrate, a P-type first epitaxial layer, and a second epitaxial layer stacked in sequence. In the TVS device, a first PN diode is connected to a Zener diode in series, wherein the series circuit is surrounded by a first shallow trench isolation (STI) region; and a second PN diode is connected in parallel to the series circuit, wherein the second PN diode is surrounded by a second STI region. The first STI region and the second STI region both extend from an upper surface to the second epitaxial layer, but not to the first epitaxial layer.

10 Claims, 8 Drawing Sheets

TRANSIENT VOLTAGE SUPPRESSION DEVICE AND MANUFACTURING METHOD THEREOF

CROSS REFERENCE

The present invention claims priority to U.S. 62/011,795, filed on Jun. 13, 2014.

BACKGROUND OF THE INVENTION

1. Field of Invention

The present invention relates to a transient voltage suppression (TVS) device and a manufacturing method thereof; particularly, it relates to such TVS device and manufacturing method thereof, which mitigates a side-wall capacitance and a parasitic transistor effect.

2. Description of Related Art

A transient voltage suppression (TVS) device is an electrostatic discharge (ESD) protection device, which includes a Zener diode and at least one PN diode. Please refer to U.S. Pat. No. 5,880,511 and US 2007/0073807 as related art. The prior art TVS device has a high capacitance, which delays the response time of the TVS device. In particular, in an operation range of a relatively lower clamp voltage, the high capacitance does not only delay the response time, but also causes the clamp voltage of the TVS device to be unstable.

In view of the above, the present invention proposes a TVS device and a manufacturing method thereof to mitigate a side-wall capacitance and a parasitic transistor effect therein.

SUMMARY OF THE INVENTION

From one perspective, the present invention provides a transient voltage suppression (TVS) device, which has a first terminal and a second terminal, for limiting a voltage drop between the first terminal and the second terminal not to exceed a clamp voltage, the TVS device comprising: a semiconductor substrate, which has a P-type conductivity, and is used as or is electrically connected to the second terminal; a first epitaxial layer having the P-type conductivity, which is formed on and connected to the semiconductor substrate; a second epitaxial layer, which is formed on and connected to the first epitaxial layer, the second epitaxial layer having an upper surface; a cap layer having the P-type conductivity, which is formed in the first epitaxial layer, and is electrically connected to the second terminal; a first buried layer having an N-type conductivity, which is formed on the cap layer; a first N-type region having the N-type conductivity, which is formed in the second epitaxial layer on the first buried layer; a first P-type region having the P-type conductivity, which is formed in the second epitaxial layer on the first N-type region, and is electrically connected to the first terminal; a first shallow trench isolation (STI) region, which extends from the upper surface to the second epitaxial layer and connects the first buried layer, but the first STI region does not extend to the first epitaxial layer, and the first STI region surrounds the first N-type region and the first P-type region from a top view; a second P-type region having the P-type conductivity, which is formed in the first epitaxial or the second epitaxial layer on the semiconductor substrate, and is electrically connected to the second terminal; a second N-type region having the N-type conductivity, which is formed in the second epitaxial layer on and connected to the second P-type region, and is electrically connected to the first terminal; and a second STI region, which extends from the upper surface to the second epitaxial layer, but the second STI region does not extend to the first epitaxial layer, and the second STI region surrounds the second N-type region and the second P-type region from the top view; wherein a Zener diode includes the cap region and the first buried layer; a first PN diode includes the first P-type region and the first N-type region; a second PN diode includes the second P-type region and the second N-type region; wherein the first PN diode and the Zener diode are connected in series, the first N-type region being electrically connected to the first buried layer, and the second PN diode is connected in parallel to the series circuit of the first PN diode and the Zener diode, wherein the second PN diode and the series circuit of the first PN diode and the Zener diode are isolated by the first STI region and the second STI region in a lateral direction.

From another perspective, the present invention provides a manufacturing method of a transient voltage suppression (TVS) device, which has a first terminal and a second terminal, for limiting a voltage drop between the first terminal and the second terminal not to exceed a clamp voltage, the manufacturing method comprising: providing a semiconductor substrate having a P-type conductivity, is used as or is electrically connected to the second terminal; forming a first epitaxial layer having the P-type conductivity on and connected to the semiconductor substrate; forming a second epitaxial layer on and connected to the first epitaxial layer, the second epitaxial layer having an upper surface; forming a cap layer having the P-type conductivity in the first epitaxial layer, the cap layer being electrically connected to the second terminal; forming a first buried layer having an N-type conductivity on the cap layer; forming a first N-type region having the N-type conductivity in the second epitaxial layer on the first buried layer; forming a first P-type region having the P-type conductivity in the second epitaxial layer on the first N-type region, the first P-type region being electrically connected to the first terminal; forming a first shallow trench isolation (STI) region, which extends from the upper surface to the second epitaxial layer and connects the first buried layer, but the first STI region does not extend to the first epitaxial layer, the first STI region surrounding the first N-type region and the first P-type region from a top view; forming a second P-type region having the P-type conductivity in the first epitaxial or the second epitaxial layer on the semiconductor substrate, the second P-type region being electrically connected to the second terminal; forming a second N-type region having the N-type conductivity in the second epitaxial layer, wherein the second N-type region is on and connected to the second P-type region, and is electrically connected to the first terminal; and forming a second STI region, which extends from the upper surface to the second epitaxial layer, but the second STI region does not extend to the first epitaxial layer, the second STI region surrounding the second N-type region and the second P-type region from the top view; wherein a Zener diode includes the cap region and the first buried layer; a first PN diode includes the first P-type region and the first N-type region; a second PN diode includes the second P-type region and the second N-type region; wherein the first PN diode and the Zener diode are connected in series, the first N-type region being electrically connected to the first buried layer, and the second PN diode is connected in parallel to the series circuit of the first PN diode and the Zener diode, wherein the second PN diode and the series circuit of the first PN diode and the Zener diode are isolated by the first STI region and the second STI region in a lateral direction.

In one preferable embodiment, the TVS device further includes a second buried layer having the P-type conductivity, which is formed beneath the second STI region and extends to the first epitaxial layer, the second buried layer surrounding the second N-type region and the second P-type region.

In one preferable embodiment, the first STI region and the second STI region share a common part of STI region, and the second PN diode and the series circuit of the first PN diode and the Zener diode are isolated only by the common part of STI region in the lateral direction.

In one preferable embodiment, the second epitaxial layer has the P-type or the N-type conductivity.

In one preferable embodiment, the TVS device further includes: a P-type ohmic contact region having the P-type conductivity, which is formed in the second epitaxial layer on the first P-type region, for electrically connecting the first terminal and the first P-type region; and an N-type ohmic contact region having the N-type conductivity, which is formed in the second epitaxial layer on the second N-type region, for electrically connecting the first terminal and the second N-type region.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
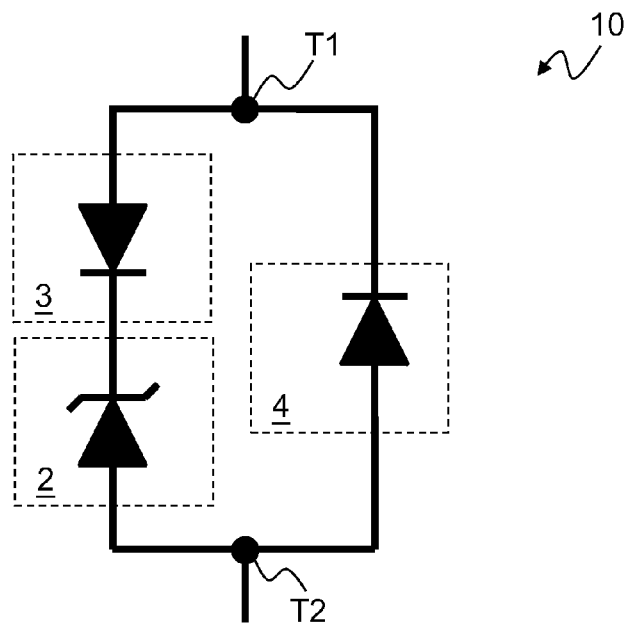
FIGS. 1A-1C show a first embodiment of the present invention.
Figure 1B:
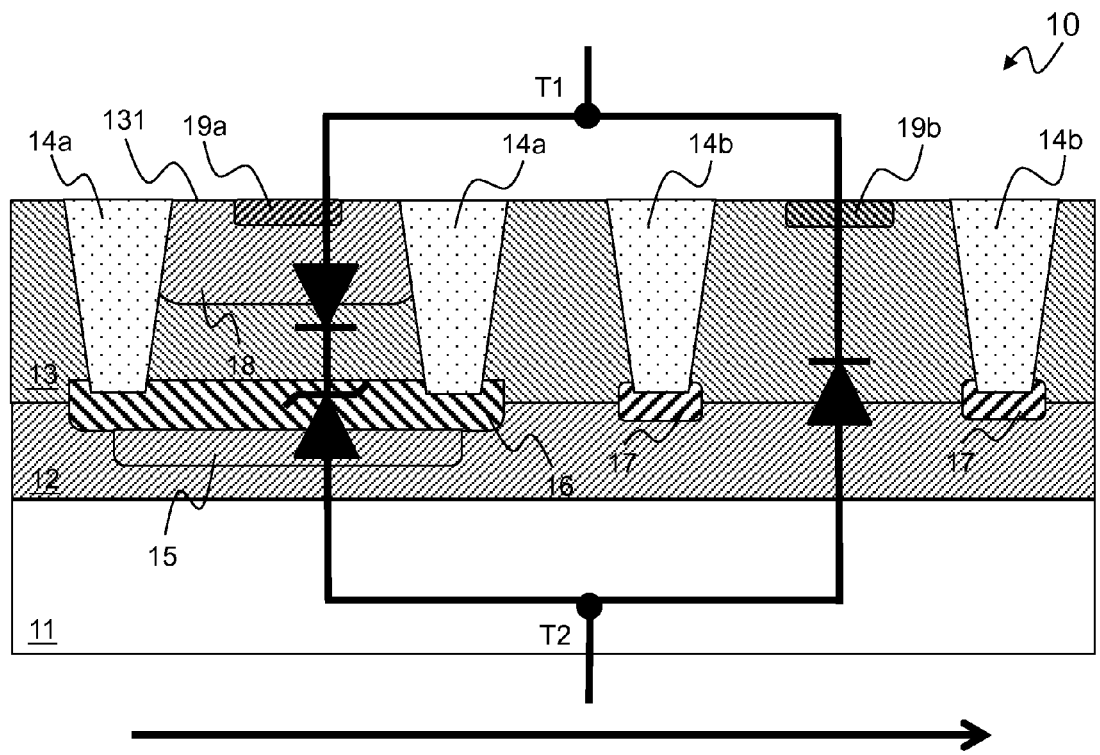
Figure 1C:
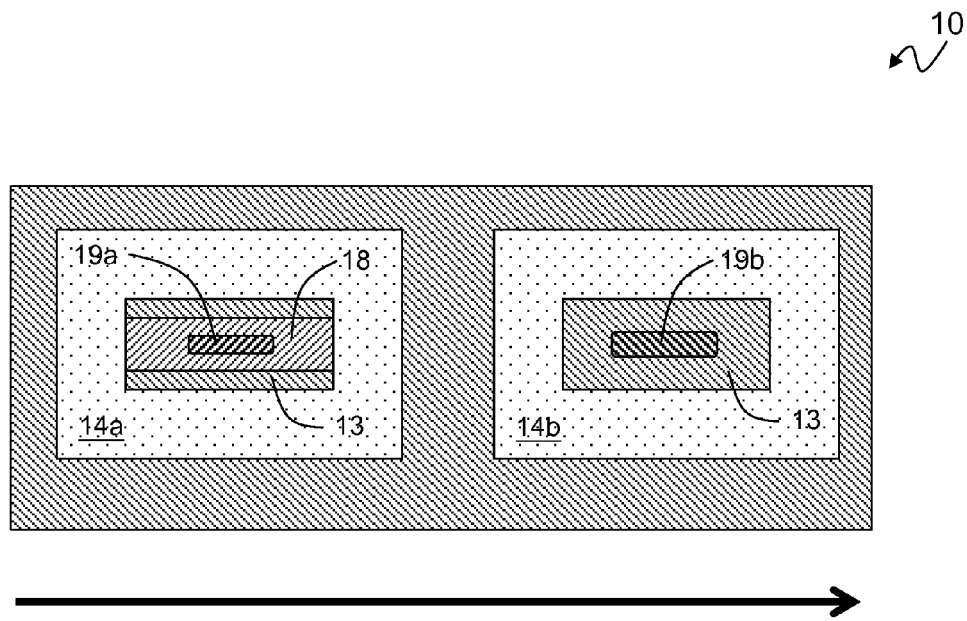

Please refer to FIGS. 1A-1C for a first embodiment according to the present invention. FIG. 1A shows a schematic circuitry diagram of a transient voltage suppression (TVS) device 10. As shown in FIG. 1A, the TVS device 10 is a two-terminal device having a terminal T1 and a terminal T2, and its function is to restrict the voltage drop between the terminal T1 and the terminal T2 so that the voltage drop does not exceed a clamp voltage, to protect a circuit which is connected to the TVS device 10 in parallel (not shown; the requirement for protection is well known by those skilled in the art, so the details thereof are not redundantly explained here). The TVS device 10 includes Zener diode 2, a PN diode 3, and a PN diode 4. The PN diode 3 is connected in series to the Zener diode 2, and the PN diode 4 is connected in parallel to the series circuit of the PN diode 3 and the Zener diode 2.

FIGS. 1B and 1C show schematic diagrams of a cross-sectional view and a top view of the TVS device 10 respectively. The TVS device 10 includes: a semiconductor substrate 11, an epitaxial layer 12, an epitaxial layer 13, a shallow trench isolation (STI) region 14a, an STI region 14b, a cap layer 15, a buried layer 16, a buried layer 17, a P-type region 18, a P-type ohmic contact region 19a, and an N-type ohmic contact region 19b. The Zener diode 2 includes the cap layer 15 and the buried layer 16. The PN diode 3 includes the P-type region 18 and the epitaxial layer 13 as its N-type region. The PN diode 4 includes the epitaxial layer 12 as its P-type region and the epitaxial layer 13 as its N-type region. In this embodiment, the semiconductor substrate 11 has a P-type conductivity, which is the terminal T2 or can be electrically connected to the terminal T2. The epitaxial layer 12 is formed on and connected to the semiconductor substrate 11, and has the P-type conductivity. The epitaxial layer 13 is formed on and connected to the epitaxial layer 12. The epitaxial layer 13 has an upper surface 131. In this embodiment, the epitaxial layer 13 for example has an N-type conductivity. The cap layer 15 is formed in the epitaxial layer 12 and has the P-type conductivity; the cap layer 15 is electrically connected to the terminal T2. The buried layer 16 is formed on the cap layer 15, and has the N-type conductivity. In this embodiment, the buried layer 16 is formed partially in the epitaxial layer 12 and partially in the epitaxial layer 13. The N-type region of the PN diode 3 is formed in the epitaxial layer 13 on the buried layer 16; for example, a part of the epitaxial layer 13 which is doped with N-type impurities is used as the N-type region of the PN diode 3. The P-type region 18 is formed in the epitaxial layer 13 on the N-type region of the PN diode 3 and has the P-type conductivity; the P-type region 18 is electrically connected to the terminal T1. The P-type region of the PN diode 4 is formed in the epitaxial layer 12 on the semiconductor substrate 11 and has the P-type conductivity; the P-type region of the PN diode 4 is electrically connected to the terminal T2. For example, apart of the epitaxial layer 12 which is doped with P-type impurities is used as the P-type region of the PN diode 4. The N-type region of the PN diode 4 is formed in the epitaxial layer 13 on the P-type region of the PN diode 4, and is connected to the P-type region of the PN diode 4. The N-type region of the PN diode 4 has the N-type conductivity, and The N-type region of the PN diode 4 is electrically connected to the terminal T1. For example, a part of the epitaxial layer 13 which is doped with N-type impurities is used as the N-type region of the PN diode 4. The STI region 14a extends from the upper surface 131 to the epitaxial layer 13, and connects the buried layer 16. The STI region 14a does not extend to the epitaxial layer 12. The STI region 14a surrounds the N-type region of the PN diode 3 and the P-type region 18 as referring to the top view of FIG. 1C and also referring to FIG. 1B. The STI region 14b extends from the upper surface 131 to the epitaxial layer 13. The STI region 14b does not extend to the epitaxial layer 12. The STI region 14b surrounds the N-type region of the PN diode 4 and the P-type region of the PN diode 4 from the top view FIG. 1C and referring to FIG. 1B. The PN diode 3 is connected in series to the Zener diode 2. The N-type region of the PN diode 3 is electrically connected to the buried layer 16. The PN diode 4 is connected in parallel to the series circuit of the PN diode 3 and the Zener diode 2. The PN diode 4 and the series circuit of the PN diode 3 and the Zener diode 2 are isolated by the STI region 14a and the STI region 14b in a lateral direction (as indicated by an arrow shown in FIG. 1B).

Still referring to FIGS. 1B and 1C, the buried layer 17 is formed beneath the STI region 14b, and it extends to the epitaxial layer 12. The buried layer 17 has the P-type conductivity. The buried layer 17 surrounds the N-type region of the PN diode 4 and the P-type region of the PN diode 4 as referring to the top view of FIG. 1C and also referring to FIG. 1B. The P-type ohmic contact region 19a is formed in the epitaxial layer 13 on the P-type region 18, and has the P-type conductivity. The P-type ohmic contact region 19a electrically connects the terminal T1 and the P-type region 18. The N-type ohmic contact region 19b is formed in the epitaxial layer 13 on the N-type region of the PN diode 4, and has the N-type conductivity. The N-type ohmic contact region 19b electrically connects the terminal T1 and the N-type region of the PN diode 4.

The present invention is advantageous over the prior art at least in that: because the STI region 14a is connected to the buried layer 16 having relatively higher N-type doped impurities, a PN junction capacitance between the N-type region of the PN diode 3 and the epitaxial layer 12 is reduced to thereby mitigate the side-wall capacitance effect, and the parasitic transistor effect is also improved. Furthermore, because the STI region 14b is connected to the buried layer 17 having relatively higher P-type doped impurities, a PN junction capacitance between the N-type region of the PN diode 4 and the epitaxial layer 13 (having P-type conductivity in this embodiment) is also reduced to thereby mitigate the side-wall capacitance effect of the PN diode 4.

Figure 2:
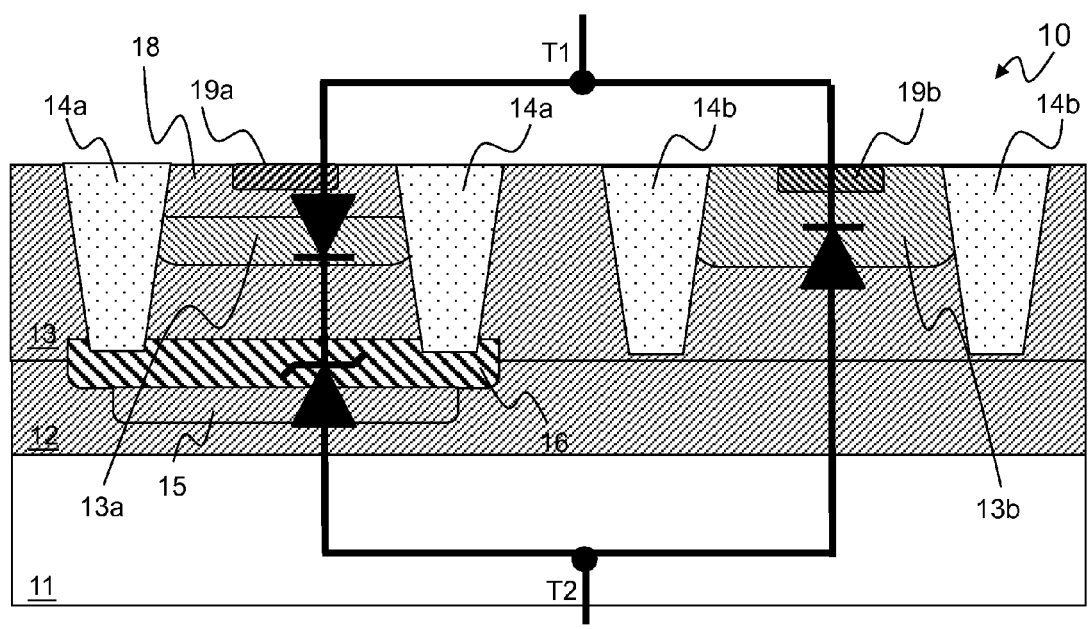
FIG. 2 shows a second embodiment of the present invention.

Please refer to FIG. 2 for a second embodiment according to the present invention. This embodiment is different from the first embodiment in that, in this embodiment, the epitaxial layer 13 has for example but not limited to the P-type conductivity, and an N-type region 13a of the PN diode 3 is formed in the epitaxial layer 13 on the buried layer 16, wherein the N-type region 13a has the N-type conductivity, and is formed for example by an ion implantation process step. The P-type region 18 is formed in the epitaxial layer 13 on the N-type region 13a of the PN diode 3, and has the P-type conductivity. The P-type region 18 is used for electrically connecting the terminal T1. In this embodiment, the buried layer 17 of the first embodiment is omitted. Besides, in this embodiment, a part of the epitaxial layer 13 is used as the P-type region of the PN diode 4, and an N-type region 13b of the PN diode 4 is formed in the epitaxial layer 13.

Figure 3:
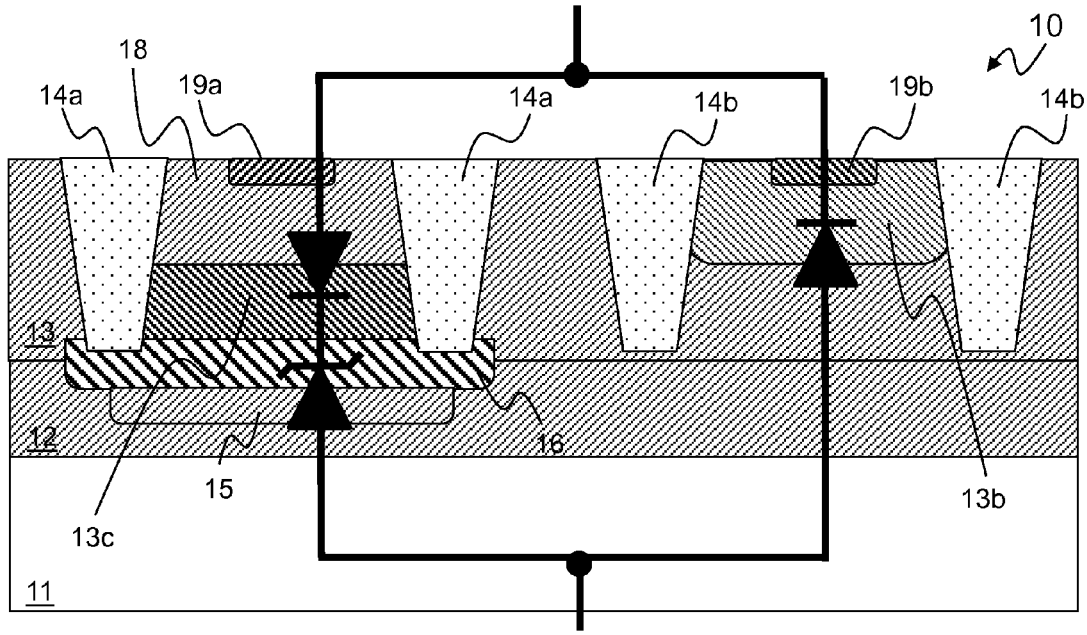
FIG. 3 show a third embodiment of the present invention.

Please refer to FIG. 3 for a third embodiment according to the present invention. This embodiment is different from the second embodiment in that, in this embodiment, an N-type region 13c of the PN diode 3 is formed in the epitaxial layer 13 on the buried layer 16, and the N-type region 13c of the PN diode 3 is connected to the buried layer 16. The N-type region 13c has the N-type conductivity.

Figure 4:
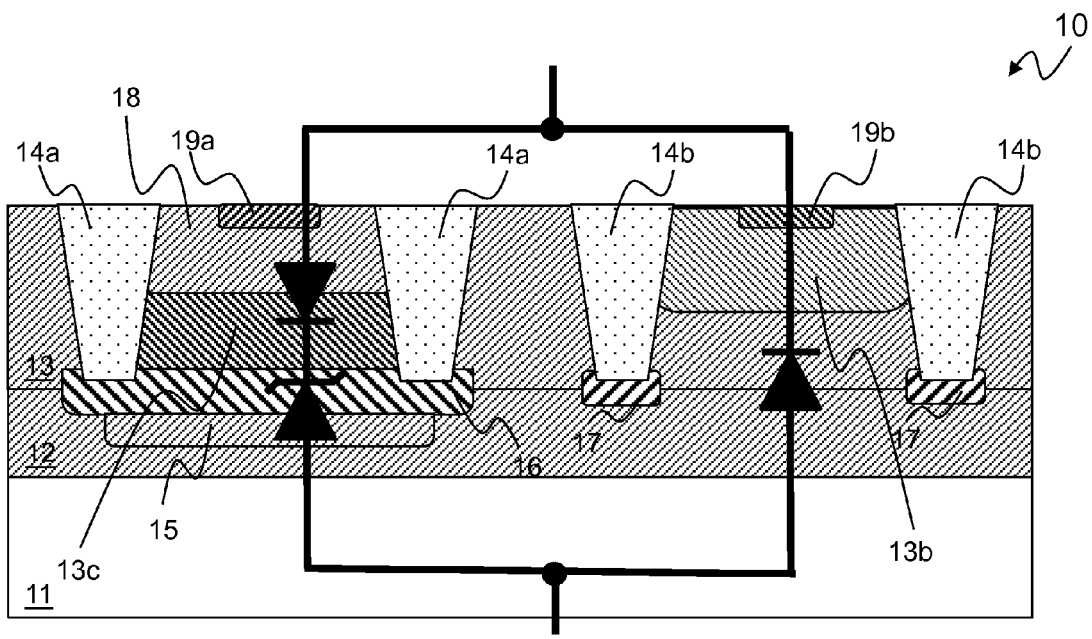
FIG. 4 shows a fourth embodiment of the present invention.

Please refer to FIG. 4 for a fourth embodiment according to the present invention. This embodiment is different from the third embodiment in that, this embodiment further includes the buried layer 17, which is formed beneath the STI region 14b and extends to the epitaxial layer 12. The buried layer 17 has the P-type conductivity. Referring to FIGS. 1B and 1C of the first embodiment, the buried layer 17 surrounds the N-type region of the PN diode 4 and the P-type region of the PN diode 4.

Figure 5A:
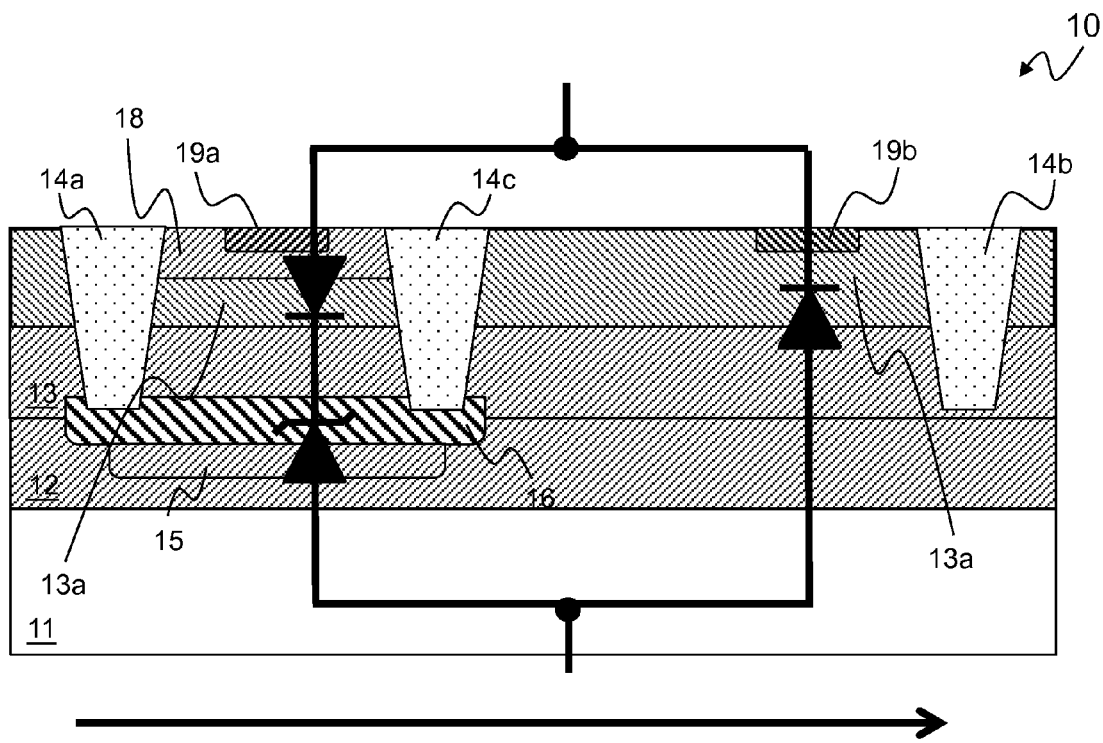
FIGS. 5A-5B show a fifth embodiment of the present invention.
Figure 5B:
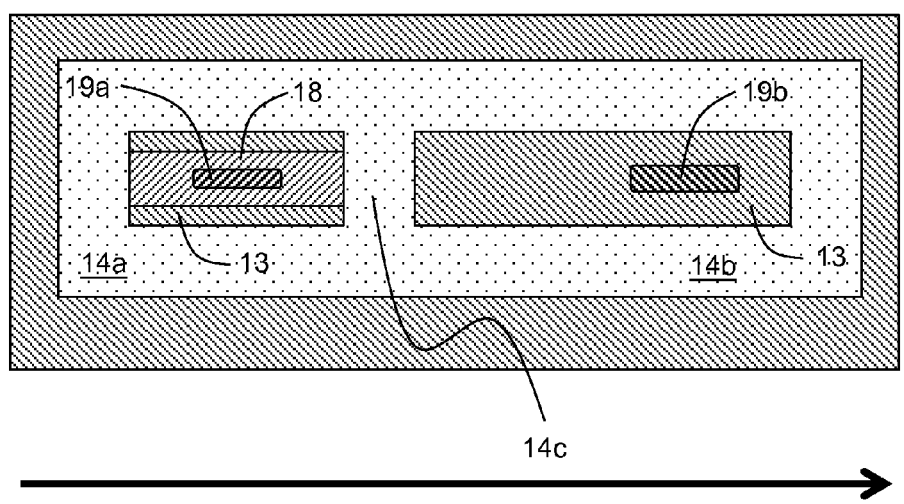

Please refer to FIGS. 5A-5B for a fifth embodiment according to the present invention. This embodiment is different from the second embodiment in that, in this embodiment, the STI region 14a and the STI region 14b share a common STI region 14c, and the PN diode 4 and the series circuit of the PN diode 3 and the Zener diode 2 are isolated only by the common STI region 14c in the lateral direction as indicated by arrows shown in FIGS. 5A and 5B.

Figure 6:
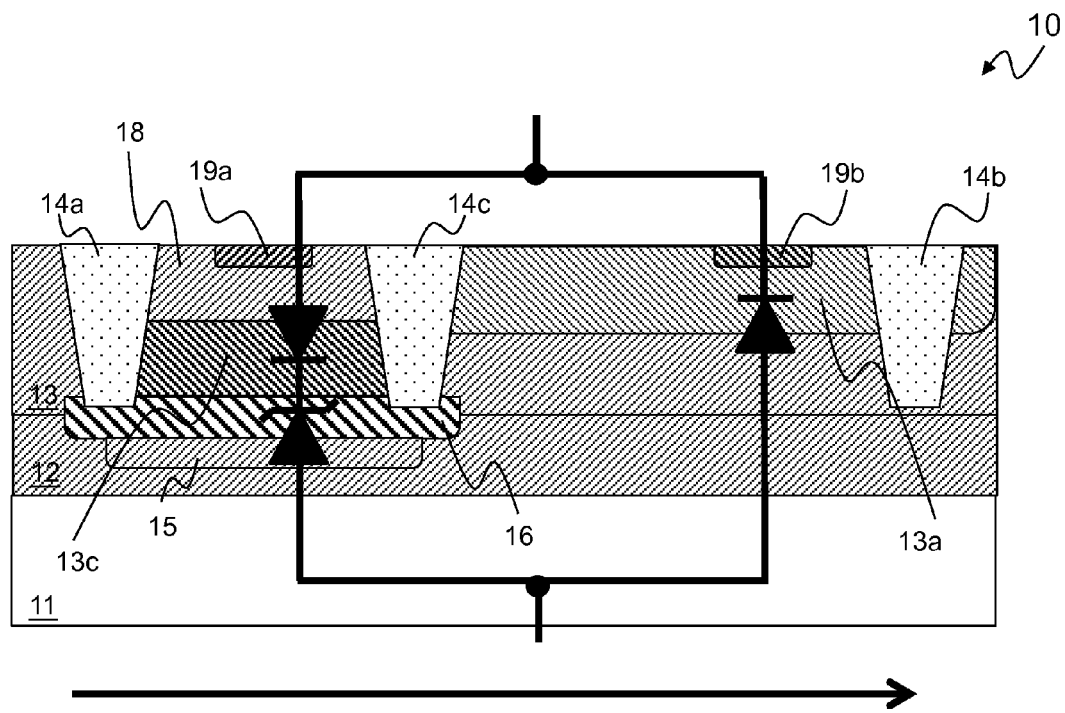
FIG. 6 shows a sixth embodiment of the present invention.

Please refer to FIG. 6 for a sixth embodiment according to the present invention. This embodiment is different from the fourth embodiment in that, in this embodiment, the STI region 14a and the STI region 14b share the common STI region 14c, and the PN diode 4 and the series circuit of the PN diode 3 and the Zener diode 2 are isolated only by the common STI region 14c in the lateral direction as indicated by an arrow shown in FIG. 6; and in this embodiment, the buried layer 17 is omitted.

Figure 7A:
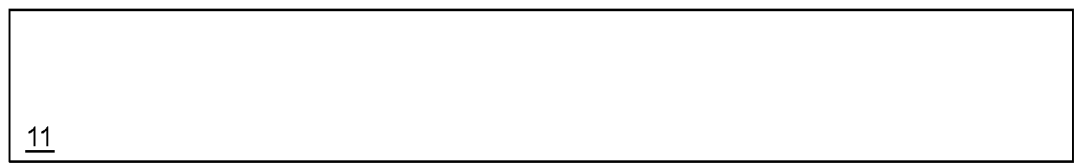
FIGS. 7A-7H show an embodiment of the manufacturing method of the TVS device 10 of the present invention.
Figure 7B:
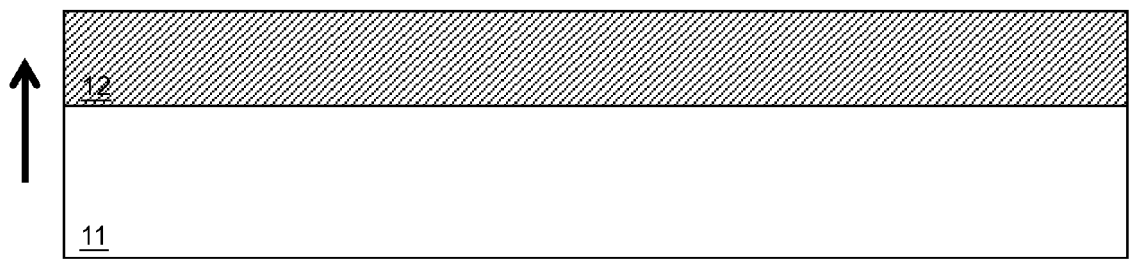
Figure 7C:
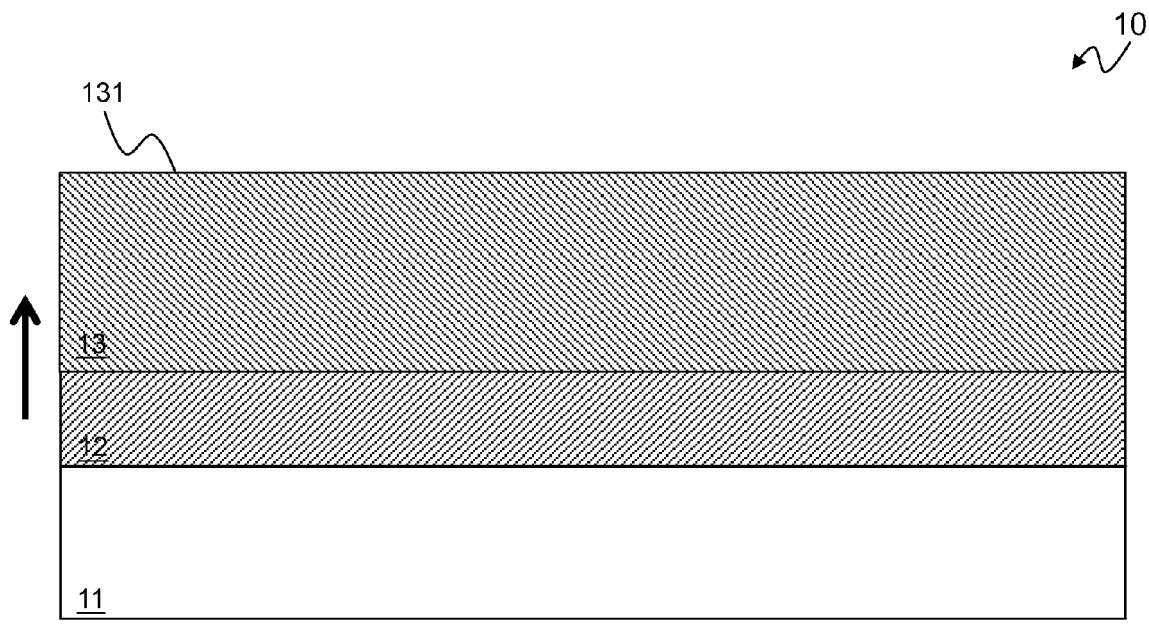
Figure 7D:
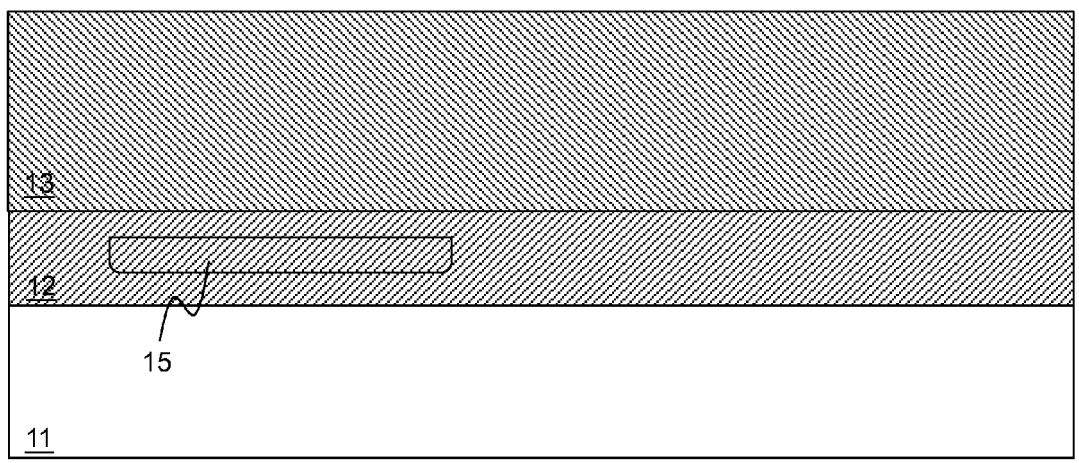
Figure 7E:
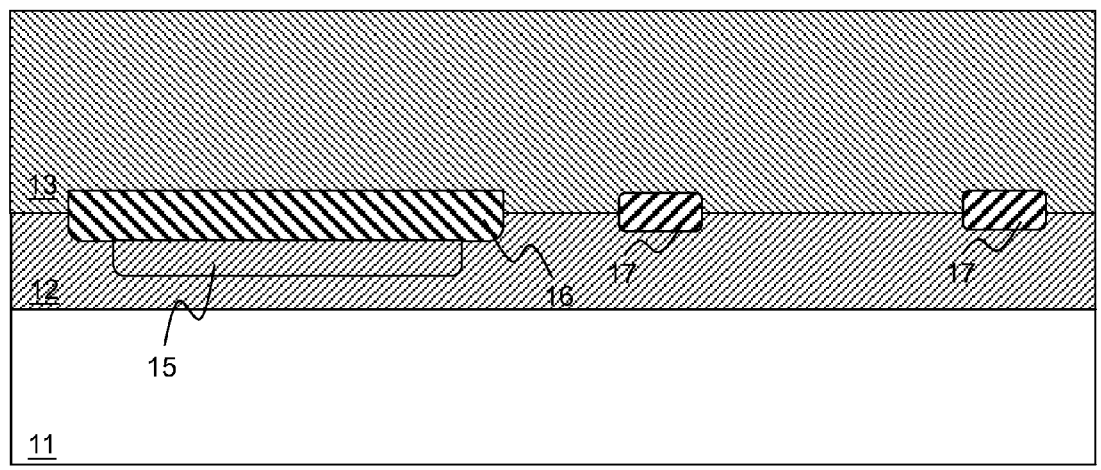
Figure 7F:
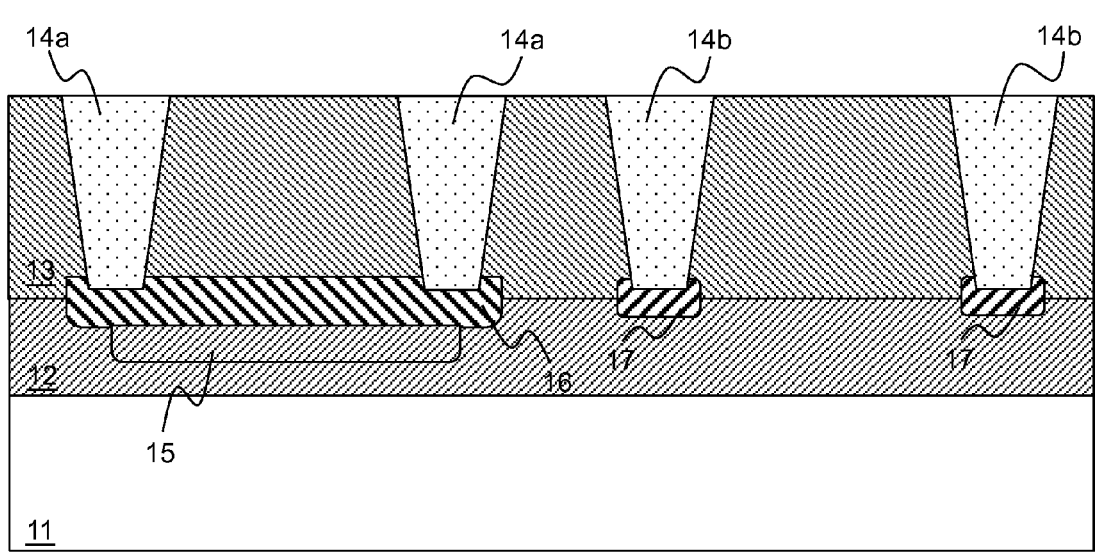

Please refer to FIGS. 7A-7H, which shows an embodiment of a manufacturing method of the TVS device 10 according to the present invention. As shown in FIG. 7A, first, the semiconductor substrate 11 is provided, which has the P-type conductivity. Next, as shown in FIG. 7B, the epitaxial layer 12 is formed on the semiconductor substrate 11, and the epitaxial layer 12 is connected to the semiconductor substrate 11 in the vertical direction as indicated by an arrow shown in the figure. The epitaxial layer 12 has the P-type conductivity. Next, as shown in FIG. 7C, the epitaxial layer 13 is formed on the epitaxial layer 12, and the epitaxial layer 13 is connected to the epitaxial layer 12 in the vertical direction. The epitaxial layer 13 has the upper surface 131 and has for example the N-type conductivity in this embodiment. Next, as shown in FIG. 7D, the cap layer 15 is formed in the epitaxial layer 12, to be electrically connected to the terminal T2. The cap layer 15 has the P-type conductivity. Next, as shown in FIG. 7E, the buried layer 16 is formed on the cap layer 15 and the buried layer 16 has the N-type conductivity. For example, a part of the buried layer 16 is formed in the epitaxial layer 12 and the other part of the buried layer 16 is formed in the epitaxial layer 13. Besides, the buried layer 17 is formed at a location beneath the STI region 14b (to be formed later, referring to FIG. 7F) and extends to the epitaxial layer 12, wherein the buried layer 17 has the P-type conductivity. The buried layer 17 surrounds the N-type region of the PN diode 4 and the P-type region of the PN diode 4 as referring to the top view of FIG. 1C and also referring to FIG. 1B. Next, as shown in FIG. 7F, the STI regions 14a and 14b are formed. The STI region 14a extends from the upper surface 131 to the epitaxial layer 13, and connects the buried layer 16, but the STI region 14a does not extend to the epitaxial layer 12. The STI region 14a surrounds the N-type region of the diode 3 and the P-type region 18 as referring to the top view of FIG. 1C and also referring to FIG. 1B. The STI region 14b extends from the upper surface 131 to the epitaxial layer 13, but the STI region 14b does not extend to the epitaxial layer 12. The STI region 14b surrounds the N-type region and the P-type region of the diode 4 as referring to the top view of FIG. 1C and also referring to FIG. 1B.

Figure 7G:
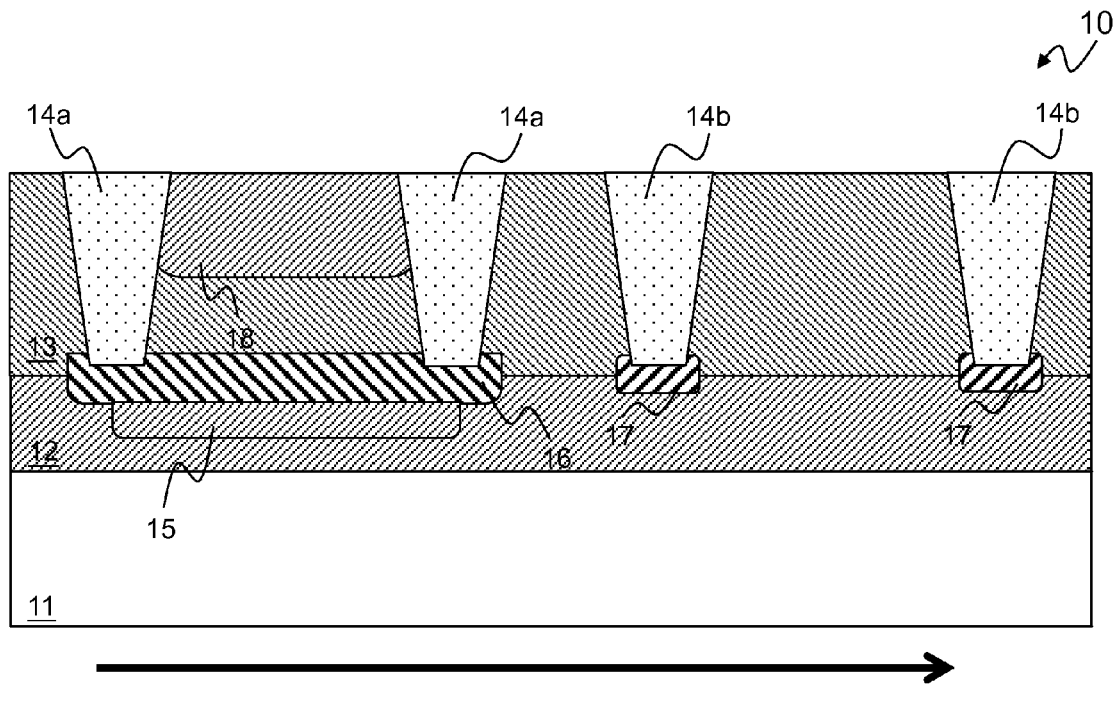
Figure 7H:
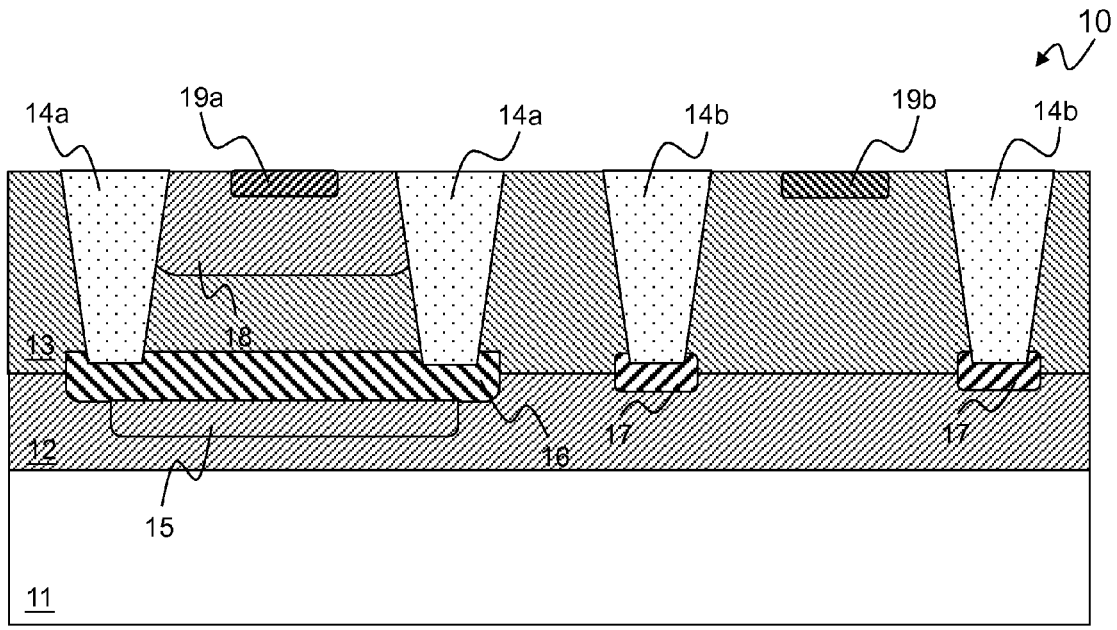

Next, as shown in FIG. 7G, a part of the epitaxial layer 13 is used as the N-type region of the PN diode 3, and the P-type region 18 is formed in the epitaxial layer 13 on the N-type region of the PN diode 3. The P-type region 18 has the P-type conductivity, to be electrically connected to the terminal T1. A part of the epitaxial layer 12 is used as the P-type region of the PN diode 4, and a part of the epitaxial layer 13 is used as the N-type region of the PN diode 4. The PN diode 3 is connected in series to the Zener diode 2. The N-type region of the PN diode 3 is electrically connected to the buried layer 16. The PN diode 4 is connected in parallel to the series circuit of the PN diode 3 and the Zener diode 2. The PN diode 4 and the series circuit of the PN diode 3 and the Zener diode 2 are isolated by the STI region 14a and the STI region 14b in a lateral direction (as indicated by an arrow shown in FIG. 7G). Next, as shown in FIG. 7H, the P-type ohmic contact region 19a is formed in the epitaxial layer 13 on the P-type region 18, for electrically connecting the terminal T1 and the P-type region 18. The P-type ohmic contact region 19a has the P-type conductivity. The N-type ohmic contact region 19b is formed in the epitaxial layer 13 on the N-type region of the PN diode 4, for electrically connecting the terminal T1 and the N-type region of the PN diode 4. The N-type ohmic contact region 19b has the N-type conductivity.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a threshold voltage adjustment region, etc., can be added; for another example, the ion implantation process step described in the above can be replaced by another process step, such as a diffusion process step. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A transient voltage suppression (TVS) device, which has a first terminal and a second terminal, for limiting a voltage drop between the first terminal and the second terminal not to exceed a clamp voltage, the TVS device comprising:
   a semiconductor substrate, which has a P-type conductivity, and is used as or is electrically connected to the second terminal;
   a first epitaxial layer having the P-type conductivity, which is formed on and connected to the semiconductor substrate;
   a second epitaxial layer, which is formed on and connected to the first epitaxial layer, the second epitaxial layer having an upper surface;
   a cap layer having the P-type conductivity, which is formed in the first epitaxial layer, and is electrically connected to the second terminal;
   a first buried layer having an N-type conductivity, which is formed on the cap layer;
   a first N-type region having the N-type conductivity, which is formed in the second epitaxial layer on the first buried layer;
   a first P-type region having the P-type conductivity, which is formed in the second epitaxial layer on the first N-type region, and is electrically connected to the first terminal;
   a first shallow trench isolation (STI) region, which extends from the upper surface to the second epitaxial layer and connects the first buried layer, but the first STI region does not extend to the first epitaxial layer, and the first STI region surrounds the first N-type region and the first P-type region from a top view;
   a second P-type region having the P-type conductivity, which is formed in the first epitaxial or the second epitaxial layer on the semiconductor substrate, and is electrically connected to the second terminal;
   a second N-type region having the N-type conductivity, which is formed in the second epitaxial layer on and connected to the second P-type region, and is electrically connected to the first terminal; and
   a second STI region, which extends from the upper surface to the second epitaxial layer, but the second STI region does not extend to the first epitaxial layer, and the second STI region surrounds the second N-type region and the second P-type region from the top view;
   wherein a Zener diode includes the cap region and the first buried layer; a first PN diode includes the first P-type region and the first N-type region; a second PN diode includes the second P-type region and the second N-type region;
   wherein the first PN diode and the Zener diode are connected in series, the first N-type region being electrically connected to the first buried layer, and the second PN diode is connected in parallel to the series circuit of the first PN diode and the Zener diode, wherein the second PN diode and the series circuit of the first PN diode and the Zener diode are isolated by the first STI region and the second STI region in a lateral direction.

2. The TVS device of claim 1, further comprising a second buried layer having the P-type conductivity, which is formed beneath the second STI region and extends to the first epitaxial layer, the second buried layer surrounding the second N-type region and the second P-type region.

3. The TVS device of claim 1, wherein the first STI region and the second STI region share a common part of STI region, and the second PN diode and the series circuit of the first PN diode and the Zener diode are isolated only by the common part of STI region in the lateral direction.

4. The TVS device of claim 1, wherein the second epitaxial layer has the P-type or the N-type conductivity.

5. The TVS device of claim 1, further comprising:
   a P-type ohmic contact region having the P-type conductivity, which is formed in the second epitaxial layer on the first P-type region, for electrically connecting the first terminal and the first P-type region; and
   an N-type ohmic contact region having the N-type conductivity, which is formed in the second epitaxial layer on the second N-type region, for electrically connecting the first terminal and the second N-type region.

6. A manufacturing method of a transient voltage suppression (TVS) device, which has a first terminal and a second terminal, for limiting a voltage drop between the first terminal and the second terminal not to exceed a clamp voltage, the manufacturing method comprising:
   providing a semiconductor substrate having a P-type conductivity, is used as or is electrically connected to the second terminal;
   forming a first epitaxial layer having the P-type conductivity on and connected to the semiconductor substrate;
   forming a second epitaxial layer on and connected to the first epitaxial layer, the second epitaxial layer having an upper surface;
   forming a cap layer having the P-type conductivity in the first epitaxial layer, the cap layer being electrically connected to the second terminal;
   forming a first buried layer having an N-type conductivity on the cap layer;
   forming a first N-type region having the N-type conductivity in the second epitaxial layer on the first buried layer;
   forming a first P-type region having the P-type conductivity in the second epitaxial layer on the first N-type region, the first P-type region being electrically connected to the first terminal;
   forming a first shallow trench isolation (STI) region, which extends from the upper surface to the second epitaxial layer and connects the first buried layer, but the first STI region does not extend to the first epitaxial layer, the first STI region surrounding the first N-type region and the first P-type region from a top view;
   forming a second P-type region having the P-type conductivity in the first epitaxial or the second epitaxial layer on the semiconductor substrate, the second P-type region being electrically connected to the second terminal;
   forming a second N-type region having the N-type conductivity in the second epitaxial layer, wherein the second N-type region is on and connected to the second P-type region, and is electrically connected to the first terminal; and
   forming a second STI region, which extends from the upper surface to the second epitaxial layer, but the second STI region does not extend to the first epitaxial layer, the second STI region surrounding the second N-type region and the second P-type region from the top view;

wherein a Zener diode includes the cap region and the first buried layer; a first PN diode includes the first P-type region and the first N-type region; a second PN diode includes the second P-type region and the second N-type region;

wherein the first PN diode and the Zener diode are connected in series, the first N-type region being electrically connected to the first buried layer, and the second PN diode is connected in parallel to the series circuit of the first PN diode and the Zener diode, wherein the second PN diode and the series circuit of the first PN diode and the Zener diode are isolated by the first STI region and the second STI region in a lateral direction.

7. The manufacturing method of claim 6, further comprising: forming a second buried layer having the P-type conductivity beneath the second STI region, wherein the second buried layer extends to the first epitaxial layer, and surrounds the second N-type region and the second P-type region.

8. The manufacturing method of claim 6, wherein the first STI region and the second STI region share a common part of STI region, and the second PN diode and the series circuit of the first PN diode and the Zener diode are isolated only by the common part of STI region in the lateral direction.

9. The manufacturing method of claim 6, wherein the second epitaxial layer has the P-type or the N-type conductivity.

10. The manufacturing method of claim 6, further comprising:
  forming a P-type ohmic contact region having the P-type conductivity in the second epitaxial layer on the first P-type region, for electrically connecting the first terminal and the first P-type region; and
  forming an N-type ohmic contact region having the N-type conductivity in the second epitaxial layer on the second N-type region, for electrically connecting the first terminal and the second N-type region.

* * * * *